(12) United States Patent
Lin et al.

(10) Patent No.: US 12,424,448 B2
(45) Date of Patent: *Sep. 23, 2025

(54) REDUCTION OF LINE WIGGLING

(71) Applicant: Taiwan Semiconductor Manufacturing Co., Ltd., Hsinchu (TW)

(72) Inventors: Jiann-Horng Lin, Hsinchu (TW); Cheng-Li Fan, New Taipei (TW); Chih-Hao Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/156,123

(22) Filed: Jan. 18, 2023

(65) Prior Publication Data

US 2023/0154760 A1 May 18, 2023

Related U.S. Application Data

(63) Continuation of application No. 17/113,734, filed on Dec. 7, 2020, now Pat. No. 11,594,419, which is a continuation of application No. 15/871,675, filed on Jan. 15, 2018, now Pat. No. 10,861,705.

(60) Provisional application No. 62/552,464, filed on Aug. 31, 2017.

(51) Int. Cl.
| | |
|---|---|
| *H01L 21/308* | (2006.01) |
| *H01L 21/033* | (2006.01) |
| *H01L 21/311* | (2006.01) |
| *H01L 21/3213* | (2006.01) |
| *H01L 21/768* | (2006.01) |

(52) U.S. Cl.
CPC ...... *H01L 21/3086* (2013.01); *H01L 21/0337* (2013.01); *H01L 21/31138* (2013.01); *H01L 21/31144* (2013.01); *H01L 21/32137* (2013.01); *H01L 21/32139* (2013.01); *H01L 21/76807* (2013.01); *H01L 21/76877* (2013.01)

(58) Field of Classification Search
None
See application file for complete search history.

(56) References Cited

U.S. PATENT DOCUMENTS

| | | |
|---|---|---|
| 6,812,140 B2 | 11/2004 | Chang et al. |
| 7,838,424 B2 | 11/2010 | Karta et al. |
| 7,863,742 B2 | 1/2011 | Yu et al. |
| 7,932,601 B2 | 4/2011 | Chang et al. |
| 8,728,332 B2 | 5/2014 | Lin et al. |
| 8,754,508 B2 | 6/2014 | Chen et al. |

(Continued)

FOREIGN PATENT DOCUMENTS

TW  201546537 A  12/2015

*Primary Examiner* — Hung K Vu
(74) *Attorney, Agent, or Firm* — Slater Matsil, LLP

(57) ABSTRACT

A method for reducing wiggling in a line includes forming a silicon patterning layer over a substrate and depositing a mask layer over the silicon patterning layer. The mask layer is patterned to form one or more openings therein. The mask layer is thinned and the one or more openings are widened, to provide a smaller height-to-width ratio. The pattern of the mask layer is then used to pattern the silicon patterning layer. The silicon patterning layer is used, in turn, to pattern a target layer where a metal line will be formed.

20 Claims, 16 Drawing Sheets

(56) References Cited

U.S. PATENT DOCUMENTS

| | | |
|---|---|---|
| 8,772,151 B2 | 7/2014 | Chen |
| 8,796,666 B1 | 8/2014 | Huang et al. |
| 8,809,185 B1 | 8/2014 | Feurprier |
| 8,822,243 B2 | 9/2014 | Yan et al. |
| 8,846,548 B2 | 9/2014 | Tu et al. |
| 8,987,142 B2 | 3/2015 | Lee et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 9,607,853 B2 | 3/2017 | Jeon et al. |
| 10,088,744 B2 | 10/2018 | Shishido et al. |
| 11,594,419 B2 * | 2/2023 | Lin .................. H01L 21/31138 |
| 2002/0192945 A1 * | 12/2002 | Nagahara .......... H01L 21/76808 |
| | | 438/949 |
| 2004/0067634 A1 | 4/2004 | Kim et al. |
| 2004/0127016 A1 * | 7/2004 | Hoog ................ H01L 21/76832 |
| | | 257/E21.579 |
| 2004/0198037 A1 * | 10/2004 | Iba .................... H01L 21/76811 |
| | | 257/E21.252 |
| 2006/0172540 A1 * | 8/2006 | Marks ............... H01L 21/32139 |
| | | 438/700 |
| 2013/0341800 A1 | 12/2013 | Tu et al. |
| 2014/0015122 A1 | 1/2014 | Chou et al. |
| 2014/0045379 A1 | 2/2014 | Chen |
| 2014/0048926 A1 | 2/2014 | Wang et al. |
| 2014/0077356 A1 | 3/2014 | Chen et al. |
| 2014/0183693 A1 | 7/2014 | Tsai et al. |
| 2014/0187103 A1 | 7/2014 | Chen et al. |
| 2014/0252558 A1 | 9/2014 | Yu et al. |
| 2014/0252597 A1 | 9/2014 | Tsai et al. |
| 2014/0252601 A1 | 9/2014 | Lu et al. |
| 2014/0252608 A1 | 9/2014 | Chen et al. |
| 2014/0262468 A1 | 9/2014 | Chen et al. |
| 2014/0264885 A1 | 9/2014 | Tsai et al. |

\* cited by examiner

REDUCTION OF LINE WIGGLING

PRIORITY CLAIM AND CROSS-REFERENCE

This application is a continuation of U.S. application Ser. No. 17/113,734, filed Dec. 7, 2020 (now U.S. Pat. No. 11,594,419, issued Feb. 28, 2023), which is a continuation of U.S. application Ser. No. 15/871,675, filed Jan. 15, 2018 (now U.S. Pat. No. 10,861,705, issued Dec. 8, 2020), which claims priority to U.S. Provisional Application No. 62/552,464, entitled "Reduction of Line Wiggling," filed on Aug. 31, 2017, which applications are incorporated herein by reference.

BACKGROUND

In order to form integrated circuits on wafers, lithography process is used. A typical lithography process involves applying a photo resist, and defining patterns on the photo resist. The patterns in the patterned photo resist are defined in a lithography mask, and are defined either by the transparent portions or by the opaque portions in the lithography mask. The patterns in the patterned photo resist are then transferred to the underlying features through an etching step, wherein the patterned photo resist is used as an etching mask. After the etching step, the patterned photo resist is removed.

With the increasing down-scaling of integrated circuits, high aspect ratio stacking of layers used in photo patterning techniques can lead to poor wiggling resistance during pattern transfer to an amorphous silicon substrate. Line wiggling can, in turn, lead to pattern defects. Pattern defects and line wiggling can result in in breaking metal pattern lines and cause the pattern to fail.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
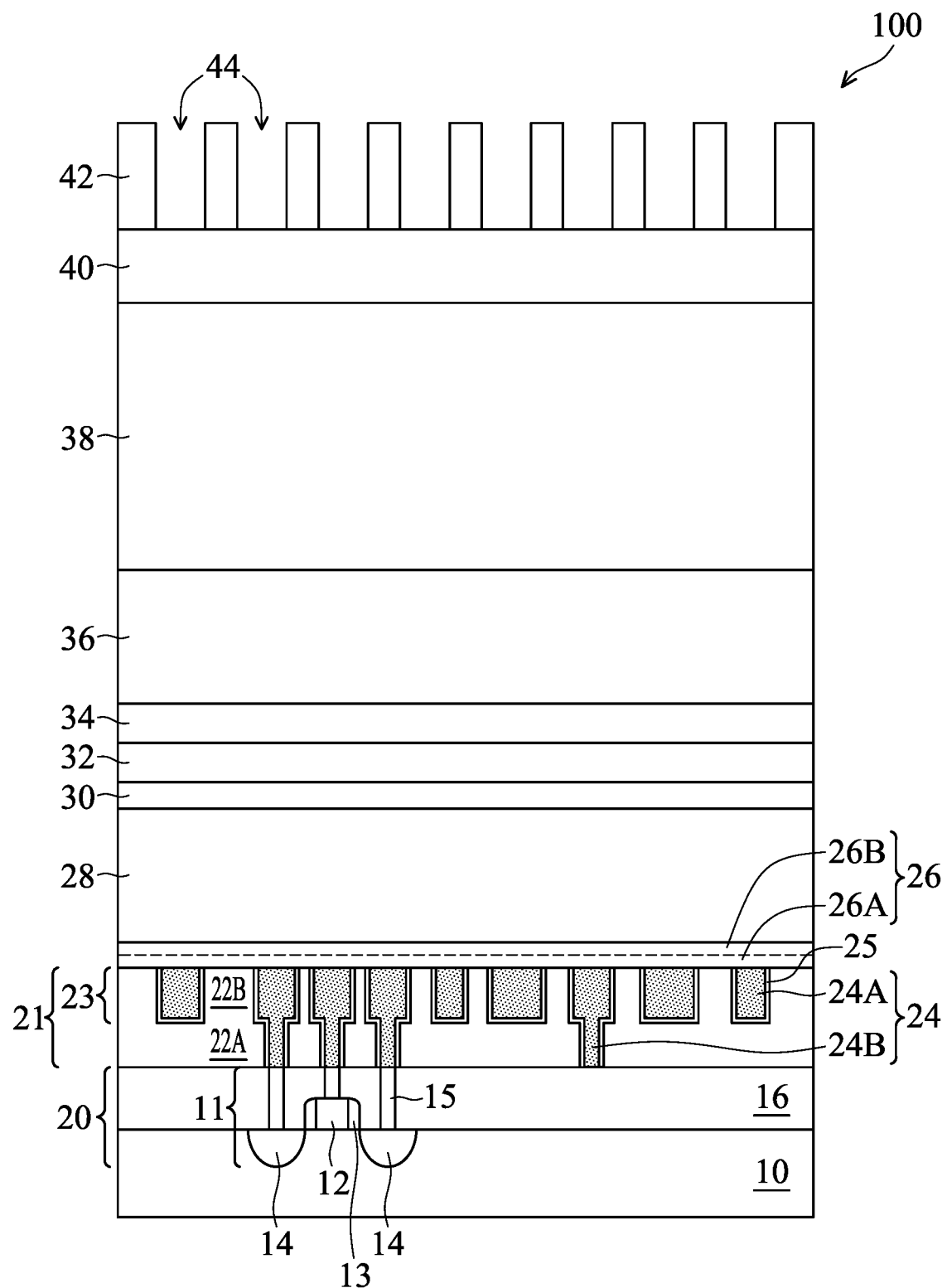
FIGS. 1 through 10 illustrate intermediate steps of a method of forming a metal line having a reduced wiggle, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present invention provide a method of producing metal lines which reduce the amount of line wiggling for the formation of metal lines. Line wiggling occurs when a pattern defined by a high aspect ratio, height to width, of a mask layer is transferred onto a patterning layer underneath. The etching of the patterning layer through the high aspect ratio mask layer causes the patterning layer to have excessive wiggling. With excessive wiggling in the patterning layer, when an underlying target layer is patterned to form openings for the metal lines, the openings and resulting metal lines will also have excessive wiggle. Excessive wiggle can cause shorts, bridging, and unplanned breaks in the subsequently formed metal lines. Embodiments reduce the height to width aspect ratio of a mask which is used to pattern the patterning layer. By reducing the height to width aspect ratio, the etching of the patterning layer results in openings which have less wiggle. Subsequently, when the patterning layer is used to pattern the target layer, the corresponding openings in the target layer are likewise straighter and result in straighter metal lines, which are less prone to shorts, bridging, and unplanned breaks.

FIGS. 1 through 11 illustrate cross-sectional views of intermediate stages in the formation of features in a target layer in accordance with some embodiments. FIG. 1 illustrates structure 100, which includes substrate 10 and the overlying layers. Structure 100 may be disposed on a wafer. Substrate 10 may be formed of a semiconductor material such as silicon, silicon germanium, or the like. In some embodiments, substrate 10 is a crystalline semiconductor substrate such as a crystalline silicon substrate, a crystalline silicon carbon substrate, a crystalline silicon germanium substrate, a III-V compound semiconductor substrate, or the like. In an embodiment the substrate 10 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Devices 20 may include both active devices and passive devices and are formed at a top surface of or within substrate 10. Active devices may comprise a wide variety of active devices such as transistors and the like and passive devices may comprise devices such as capacitors, resistors, inductors and the like that together may be used to generate the desired structural and functional parts of the design. The active devices and passive devices may be formed using any suitable methods either within or else on the substrate 10. For example, one device of devices 20 may be transistor 11, which includes a gate electrode 12, gate spacers 13, and source/drain regions 14. Gate and source/drain contacts 15 can be used to electrically couple to transistor 11. Transistor 11 may be a fin or planar field effect transistor (FET), and may be an n-type or p-type transistor or part of a complimentary metal-oxide semiconductor (CMOS). A dielectric layer 16 may include one or more layers of dielectric material in which gate and source/drain contacts 15 are electrically coupled to active devices and passive devices.

Metallization structure 21 is formed over substrate 10. Metallization structure 21 includes one or more metallization layers 23. FIG. 1 illustrates metallization structure 21 having one metallization layer 23. Each metallization layer 23 includes a dielectric layer 22B with conductive features 24 formed therein. Metallization structure 21 may be, for example, an interconnect or redistribution structure. Metallization structure 21 may include a dielectric layer 22A separating the one or more metallization layers 23 from the substrate and from each other, such as an Inter-Metal Dielectric (IMD) layer or an Inter-Layer Dielectric (ILD) layer, which may include a dielectric material having a low dielectric constant (k value) lower than 3.8, lower than about 3.0, or lower than about 2.5, for example, and conductive features 24. The dielectric layer 22A and 22B of the metallization structure 21 may be formed of phosphosilicate glass (PSG), borosilicate glass (BSG), boron-doped phosphosilicate glass (BPSG), fluorine-doped silicate glass (FSG), tetraethyl orthosilicate (TEOS), Black Diamond (a registered trademark of Applied Materials Inc.), a carbon-containing low-k dielectric material, Hydrogen SilsesQuioxane (HSQ), Methyl SilsesQuioxane (MSQ), or the like.

Metallization structure 21 is formed over substrate 10 and devices 20 and couples various devices 20 together and provides input/output to form functional circuitry for the circuit design. In an embodiment, metallization structure 21 is formed of alternating dielectric layers 22A and metallization layers 23 and may be formed through any suitable process (such as deposition, damascene, dual damascene, etc.). In an embodiment there may be one or more metallization layers 23 separated from substrate 10 and from each other by at least one dielectric layer 22A. The precise number of metallization layers 23 and dielectric layers 22A is dependent upon the design.

The conductive features 24 may include metal lines 24A as part of the one or more metallization layers 23 and conductive vias 24B through the at least one dielectric layer 22A. Metal lines 24A are used for routing signals. Conductive vias 24B may extend through the dielectric layer 22A to contact underlying features. In an embodiment, the conductive features 24 may be a material such as copper formed using, e.g., a damascene or dual damascene process, whereby an opening is formed within the metallization layer 23, the opening is filled and/or overfilled with a conductive material such as copper or tungsten, and a planarization process is performed to embed the conductive material within the metallization layer 23. However, any suitable material and any suitable process may be used to form the conductive features 24. In some embodiments, a barrier layer 25 may surround the conductive features 24. In some embodiments, conductive features 24 may be contacts of a die.

Etch stop layer (ESL) 26 may comprise a dielectric material such as silicon carbide, silicon nitride, or the like. ESL 26 may be formed of a nitride, a silicon-carbon based material, a carbon-doped oxide, and/or combinations thereof. The formation methods include Plasma Enhanced Chemical Vapor Deposition (PECVD) or other methods such as High-Density Plasma CVD (HDPCVD), Atomic Layer Deposition (ALD), low pressure CVD (LPCVD), physical vapor deposition (PVD), and the like. In accordance with some embodiments, ESL 26 is also used as a diffusion barrier layer for preventing undesirable elements, such as copper, from diffusing into a subsequently formed low-k dielectric layer (e.g., dielectric layer 28, descried in detail below). ESL 26 may include Carbon-Doped Oxide (CDO), carbon-incorporated silicon oxide (SiOC) or oxygen-Doped Carbide (ODC). ESL 26 may also be formed of Nitrogen-Doped silicon Carbide (NDC).

ESL 26 may comprise one or more distinct layers. In some embodiments, a first etch stop layer 26A is used to protect the underlying structures and provide a control point for a subsequent etching process through, for example, the second etch stop layer 26B. The first etch stop layer 26A may be deposited to a thickness of between about 10 Å and about 100 Å, such as about 40 Å. Other suitable thicknesses may be used.

Once the first etch stop layer 26A has been formed to cover the conductive features 24, in some embodiments, a second etch stop layer 26B is formed over the first etch stop layer 26A. In some embodiments, the second etch stop layer 26B is formed of a material different than the first etch stop layer 26A. The material of the second etch stop layer 26B may be formed using a deposition process such as those listed above, and may be deposited to a thickness of between about 10 Å and about 100 Å, such as about 40 Å. However, any suitable process of formation and thickness may be utilized.

Further illustrated in FIG. 1 is dielectric layer 28 formed over etch stop layer 26. In accordance with some embodiments of the present disclosure, dielectric layer 28 is formed of a low-k dielectric material having a dielectric constant (k-value) lower than about 3.0, about 2.5, or even lower. Dielectric layer 28 may be formed using a material selected from the same group of candidate materials for forming dielectric layer 22A. When selected from the same group of candidate materials, the materials of dielectric layer 22A and dielectric layer 28 may be the same or different from each other. In accordance with some embodiments, dielectric layer 28 is a silicon and carbon containing low-k dielectric layer. Dielectric layer 28 may also be referred to as a target layer, which will have openings formed therein according to a plurality of patterns and filled with metal lines and plugs, in accordance with embodiments of the present disclosure.

In some embodiments, over dielectric layer 28 resides a mask 30. In some embodiments, mask 30 may be a dielectric hard mask, which may be formed of silicon oxide (such as tetraethylorthosilicate (TEOS) oxide), Nitrogen-Free Anti-Reflective Coating (NFARC, which is an oxide), silicon carbide, silicon oxynitride, or the like. The formation methods include Plasma Enhance Chemical Vapor Deposition (PECVD), High-Density Plasma (HDP) deposition, or the like.

A mask 32 is formed over mask 30 or dielectric layer 28. In some embodiments, mask 32 may be a hard mask. In some embodiments, mask 32 is a metal hard mask and may include one or more metals, such as titanium (Ti) or tantalum (Ta). In some embodiments, the metal of mask 32 may be in the form of a metal nitride such as titanium nitride (TiN) or tantalum nitride (TaN). In some embodiments, mask 32 may be formed of a non-metal nitride such as silicon nitride, an oxynitride such as silicon oxynitride, or the like. The formation methods of mask 32 include Physical Vapor Deposition (PVD), Radio Frequency PVD (RFPVD), Atomic Layer Deposition (ALD), or the like.

Dielectric mask 34 is formed over mask 32. In some embodiments, dielectric mask 34 may be a hard mask. Dielectric mask 34 may be formed of a material selected from the same candidate material of mask 30, and may be formed using a method that is selected from the same group of candidate methods for forming mask 30. Mask 30 and dielectric mask 34 may be formed of the same material, or may comprise different materials. In some embodiments, dielectric mask 34 may be patterned after deposition to expose portions of the underlying mask 32. In such embodiments, the dielectric mask 34 may be used to etch the underlying target layer 28.

Pattern mask layer 36 is formed over dielectric mask 34. In some embodiments, pattern mask layer 36 is formed of amorphous silicon or another material that has a high etching selectivity with the underlying dielectric mask 34. In some embodiments, pattern mask layer 36 may be a mandrel layer such as when using a self-aligned double patterning (SADP) technique. In some embodiments, pattern mask layer 36 may be a pattern to be used in a one-patterning-one-etching (1P1E) process. In accordance with some embodiments, pattern mask layer may be used in a two-patterning-two-etching (2P2E) process, wherein two neighboring openings (see, e.g., openings 54 of FIG. 6) are formed in different lithography processes, so that neighboring openings may be located close to each other without incurring optical proximity effect. Additional patterning steps can be used on pattern mask layer 36, such as three-patterning-three-etching (3P3E), and so on, or combinations of the techniques discussed above.

After pattern mask layer 36 is patterned (see pattern mask layer 236 of FIG. 6), it will be used in a subsequent process as a mask which will result in patterning the target dielectric layer 28. When the height-to-width aspect ratio of the openings is high, the resulting metal features (e.g., metal lines) in the target dielectric layer 28 will wiggle, i.e., not be relatively straight, as a result of the etch process. Embodiments discussed herein control the height-to-width ratio of the openings which will be formed which result in metal features which have little to no wiggle.

Still referring to FIG. 1, a tri-layer is formed over the pattern mask layer 36, the tri-layer comprising a bottom layer 38, a middle layer 40 over the bottom layer 38, and an upper layer 42 over the middle layer 40. In some embodiments, bottom layer 38 and upper layer 42 are formed of photo resists, which comprise organic materials. Middle layer 40 may comprise an inorganic material, which may be a carbide (such as silicon oxycarbide), a nitride (such as silicon nitride), an oxynitride (such as silicon oxynitride), an oxide (such as silicon oxide), or the like. Middle layer 40 has a high etching selectivity relative to upper layer 42 and bottom layer 38, and hence upper layer 42 is used as an etching mask for the patterning of middle layer 40, and middle layer 40 is used as an etching mask for the patterning of bottom layer 38.

The thickness of the bottom layer 38 may be between about 300 Å and 1200 Å, such as about 600 Å. The thickness of the middle layer 40 may be between about 100 and 500 Å, such as about 300 Å. The thickness of the upper layer 42 may be between about 500 and 1500 Å, such as about 1000 Å. Although example ranges and thicknesses of the layers are provided, other thicknesses of these layers can be used.

After the upper layer 42 is formed, upper layer 42 is patterned as illustrated in FIG. 1 using an acceptable photolithography technique. The upper layer 42 includes openings 44 therein. In a top view of structure 100, openings 44 may have shapes such as strips, round vias, or conductive patterns.

Figure 2:
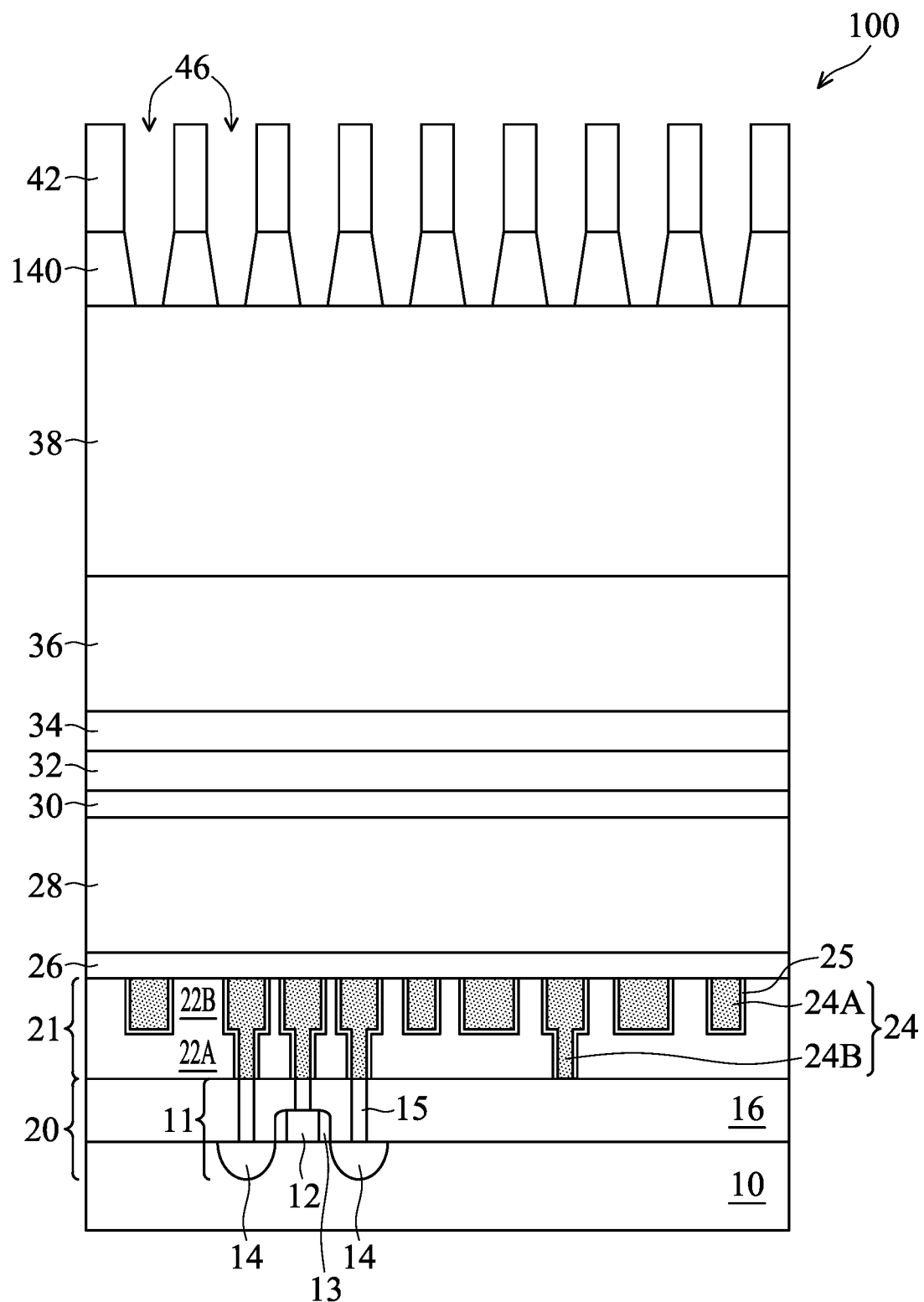

Next, referring to FIG. 2, middle layer 40 is etched to form patterned middle layer 140. Middle layer 40 is etched using the upper layer 42 as an etching mask, so that the pattern of upper layer 42 is transferred to middle layer 40 to create a patterned middle layer 140. Patterned middle layer 140 has openings 46 which have been extended from openings 44. During the patterning of middle layer 40 into patterned middle layer 140, upper layer 42 may be partially, or entirely, consumed. Etching the middle layer 40 may result in openings 46 in patterned middle layer 140 which have an opening which is wider at the top of the etching profile and narrower at the bottom. In other words, the resulting profile of the openings 46 in patterned middle layer 140 may be tapered. Any suitable etching technique may be used, such as a wet or dry etch using an etchant which is selective to patterned middle layer 140 material.

Figure 3:
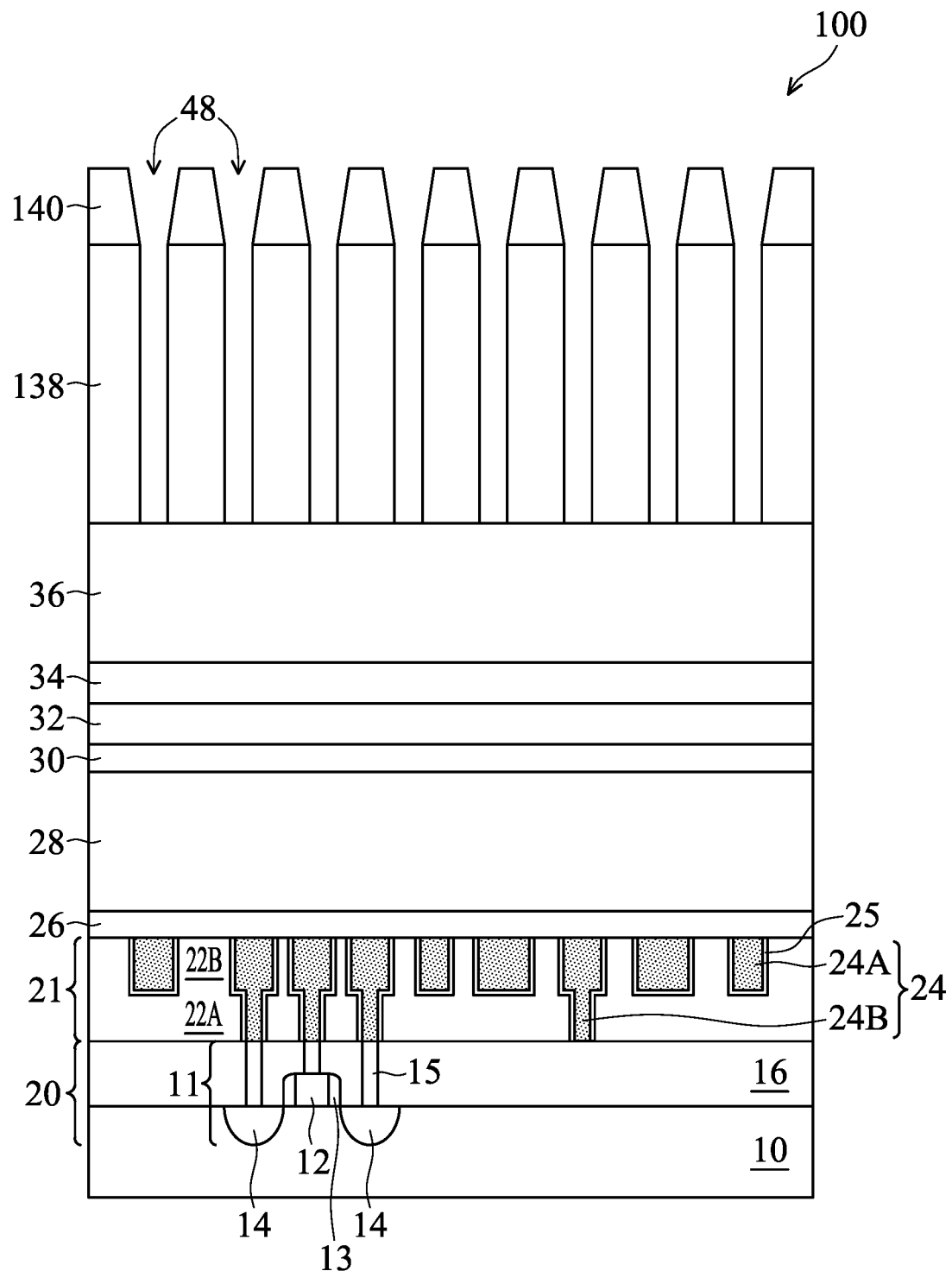

Turning to FIG. 3, the bottom layer 38 is then etched to form patterned bottom layer 138. Bottom layer 38 is etched using patterned middle layer 140 as an etching mask, so that the pattern of patterned middle layer 140 is transferred to bottom layer 38 to create patterned bottom layer 138. Patterned bottom layer 138 has openings 48 which have been extended from openings 46 (FIG. 2). Upper layer 42 will also be fully consumed during the patterning of bottom layer 38 if it has not been fully consumed in the patterning of patterned middle layer 140. Openings 48 are formed in in patterned bottom layer 138. Openings 48 may be tapered or may have vertical sidewalls, within process variations. Any suitable etching technique may be used, such as a wet or dry etch using an etchant which is selective to the material of patterned bottom layer 138. The bottom layer 38 etch process may be performed for an etch time $t_{BT}$ between about 5 sec and about 20 sec, such as about 8 sec, at a pressure between about 3 mTorr and about 60 mTorr, such as about 15 mTorr, a temperature between about 25° C. and about 80° C., such as about 45° C., with a bias voltage applied at a power between about 10 V and about 400 V, such as about 110 V. Other environmental conditions and etch times may be used.

Figure 4:
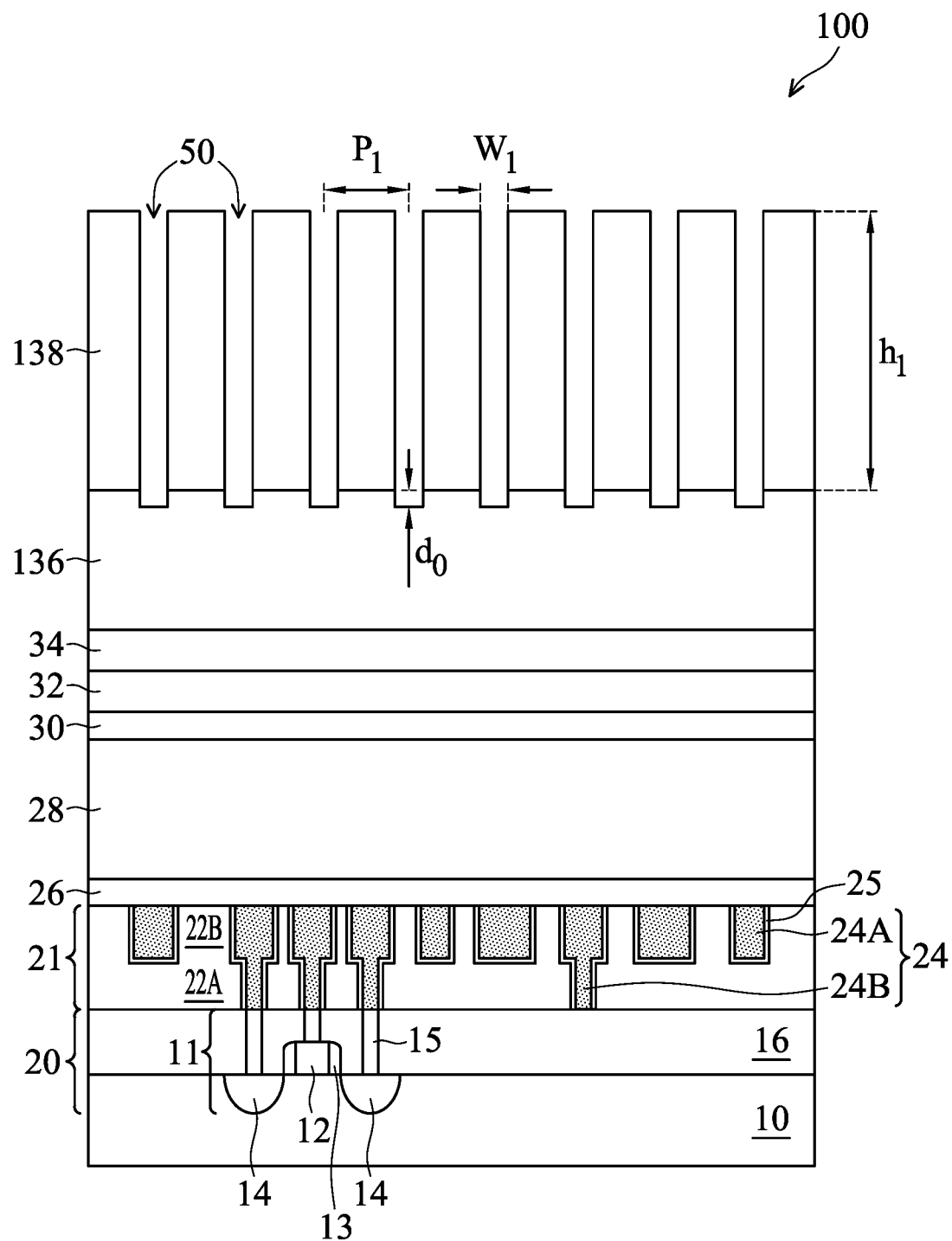

Referring now to FIG. 4, a breakthrough (BT) etch process is performed as a first etch process on pattern mask layer 36 to form pattern mask layer 136. Pattern mask layer 36 is etched using the bottom layer 138 as an etching mask, so that the pattern of patterned bottom layer 138 is transferred to a top portion of pattern mask layer 36 to create a pattern mask layer 136. The patterned mask layer 136 has openings 50 which have been extended from openings 48 (FIG. 3). Also, during the BT etch, the patterned middle layer 140 will be fully consumed. The BT etch process can use any suitable etch process, such as a dry etch process. In some embodiments, for example, where the pattern mask layer 136 is formed of silicon, the BT etch process may be a reactive ion etch (RIE) process with etch process gases including a form of fluorine, such as $CHF_3$, $CF_4$, $CH_2F_2$, $SF_3$, the like, or a combination thereof. Additional process gasses may be used, such as Ar, $N_2$, $O_2$, and the like, or a combination thereof. The BT etch process may be exothermic. The RIE process may be performed for an etch time $t_{BT}$ between about 5 sec and about 20 sec, such as about 10 sec, at a pressure between about 3 mTorr and about 60 mTorr, such as about 10 mTorr, and a temperature between about 20° C. and about 60° C., such as about 40° C. Other environmental conditions and etch times may be used.

Following the BT etch process, the initial breakthrough in openings 50, may have a depth $d_0$ between about 1 nm and about 10 nm, such as about 5 nm. The pitch $p_1$ of the openings 50 may be between about 30 nm and about 50 nm, such as about 40 nm. The width $w_1$ of the openings 50 may be between about 5 nm and about 30 nm, such as about 10 nm. The height $h_1$ of the portion of opening 50 in pattern mask layer 136 may be between about 20 nm and about 100 nm, such as about 40 nm. Although example depth $d_0$, pitch $p_1$, height $h_1$, and width $w_1$ ranges and values are given, other ranges and values may be used. A ratio of the height $h_1$ to width $w_1$ can be about 3 to 15.

Figure 5:
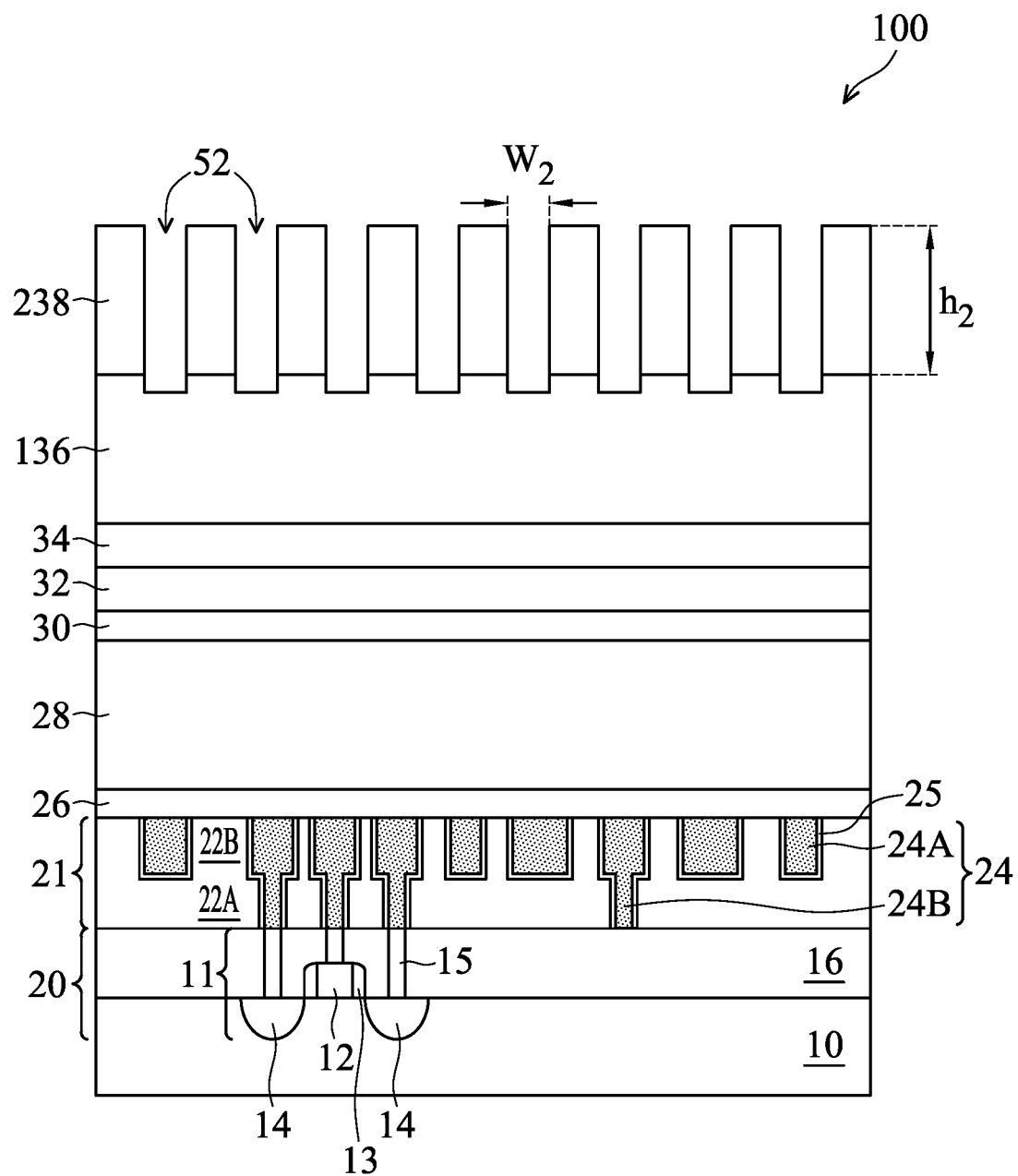

FIG. 5 illustrates structure 100 following a further etch of patterned bottom layer 138 to reduce the height of patterned bottom layer 138 and produce patterned bottom layer 238. The further etch of patterned bottom layer 138 may be an anisotropic or semi-anisotropic dry etch using a suitable etchant selective to the material of patterned bottom layer 138. The further etch resulting in patterned bottom layer 238 may be performed for an etch time $t_{BT}$ between about 3 sec and about 15 sec, such as about 8 sec, at a pressure between about 3 mTorr and about 60 mTorr, such as about 30 mTorr, a temperature between about 20° C. and about 60° C., such as about 40° C., with a bias voltage applied at a power between about 5 V and about 400 V, such as about 100 V. The further etch resulting in patterned bottom layer 238 can be performed at a higher power than the initial etch which resulted in patterned bottom layer 138. The anisotropic etch causes the top surfaces of the material of patterned bottom layer 138 to be removed, thereby reducing the height of openings 50 through patterned bottom layer 238 to form openings 52. Also, openings 50 may be widened in the same etching process or a separate etching process to form openings 52. Thus, the both the height of openings 50 and width of openings 50 may be altered to create openings 52. The height $h_2$ of the portion of the opening 52 which is through the pattern mask layer 136 (not including the breakthrough) may result from reducing height $h_1$ by about 25% to 75% depending on process gasses and etching parameters. Similarly, the width $w_2$ of the portion of the opening which is through the pattern mask layer 136 may result from increasing width $w_1$ by about 25% to 75% depending on process gasses and etching parameters. After the further etching of the patterned bottom layer 138, a ratio of the height $h_2$ to width $w_2$ in the patterned bottom layer 238 may be about 1.5 to 4, such as about 2. In some embodiments the height of the patterned bottom layer 138 can be reduced by a chemical mechanical polish (CMP) process instead of or in addition to the etch of the patterned bottom layer 138.

Because the height-to-width aspect ratio has been reduced in the patterned bottom layer 238, the possibility of wiggling lines is diminished in the subsequent etching of the target layer, discussed below with respect to FIG. 9.

Figure 6:
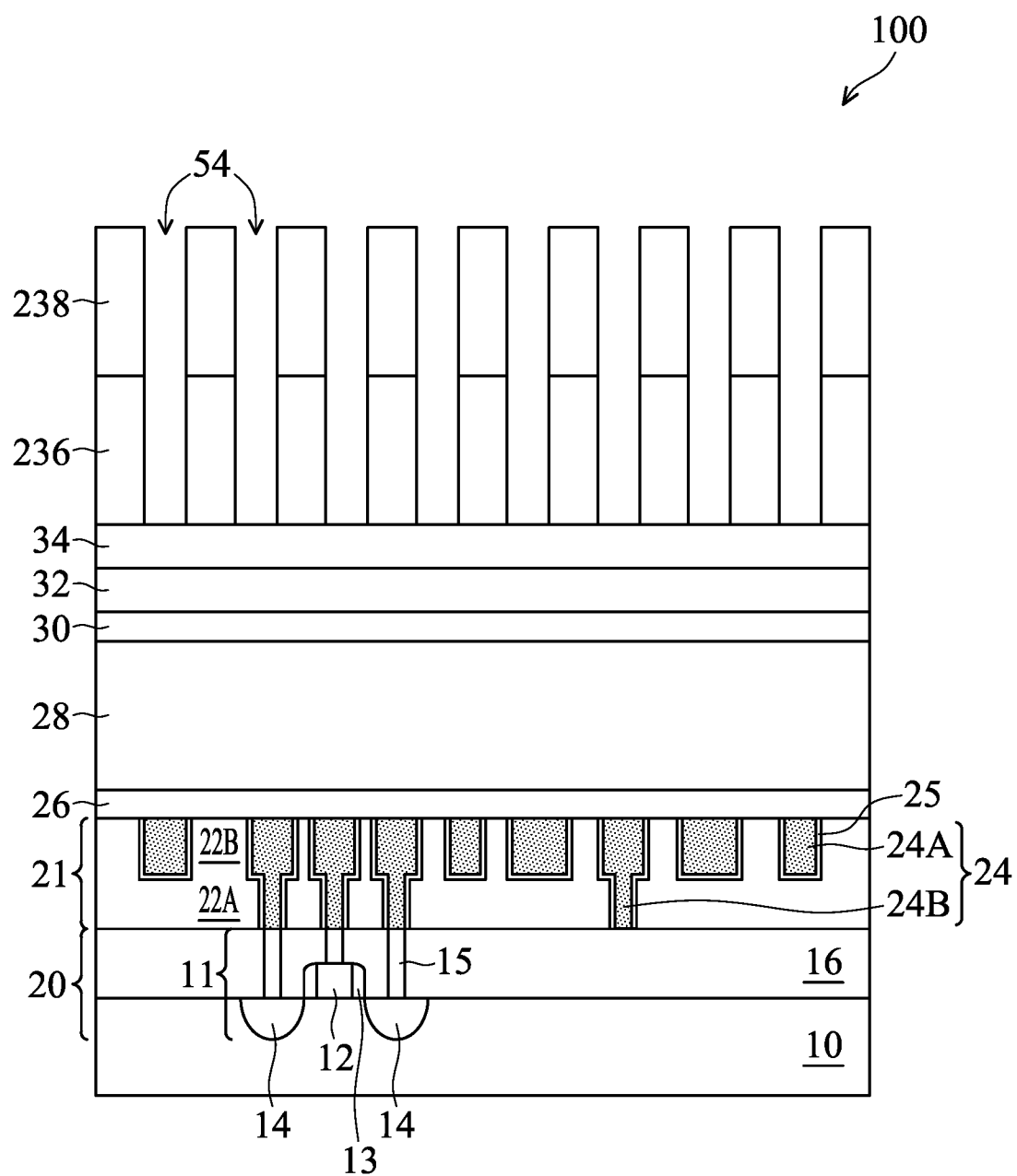

FIG. 6 illustrates an anisotropic etching of pattern mask layer 136 to form pattern mask layer 236. Pattern mask layer 136 is etched using patterned bottom layer 238 as an etching mask, so that the pattern of patterned bottom layer 238 is transferred to pattern mask layer 136 to create a pattern mask layer 236. The patterned mask layer 236 has openings 54 which have been extended from openings 52. The etching technique may include a dry etch, using a suitable etchant.

In some embodiments, the etchant selected for etching the pattern mask layer 236 may be a fluorine free etchant, such as a chlorine based etchant. In other embodiments, other etchants may be used, including fluorine based etchants. Dielectric mask 34 under the pattern mask layer 236 may serve as an etch stop layer for the etching through of the pattern mask layer 236.

The dry etch process illustrated by FIG. 6 may be performed for an etch time $t_{BT}$ between about 3 sec and about 20 sec, such as about 8 sec, at a pressure between about 3 mTorr and about 60 mTorr, such as about 30 mTorr, and a temperature between about 20° C. and about 60° C., such as about 40° C. Other environmental conditions and etch times may be used.

Figure 7:
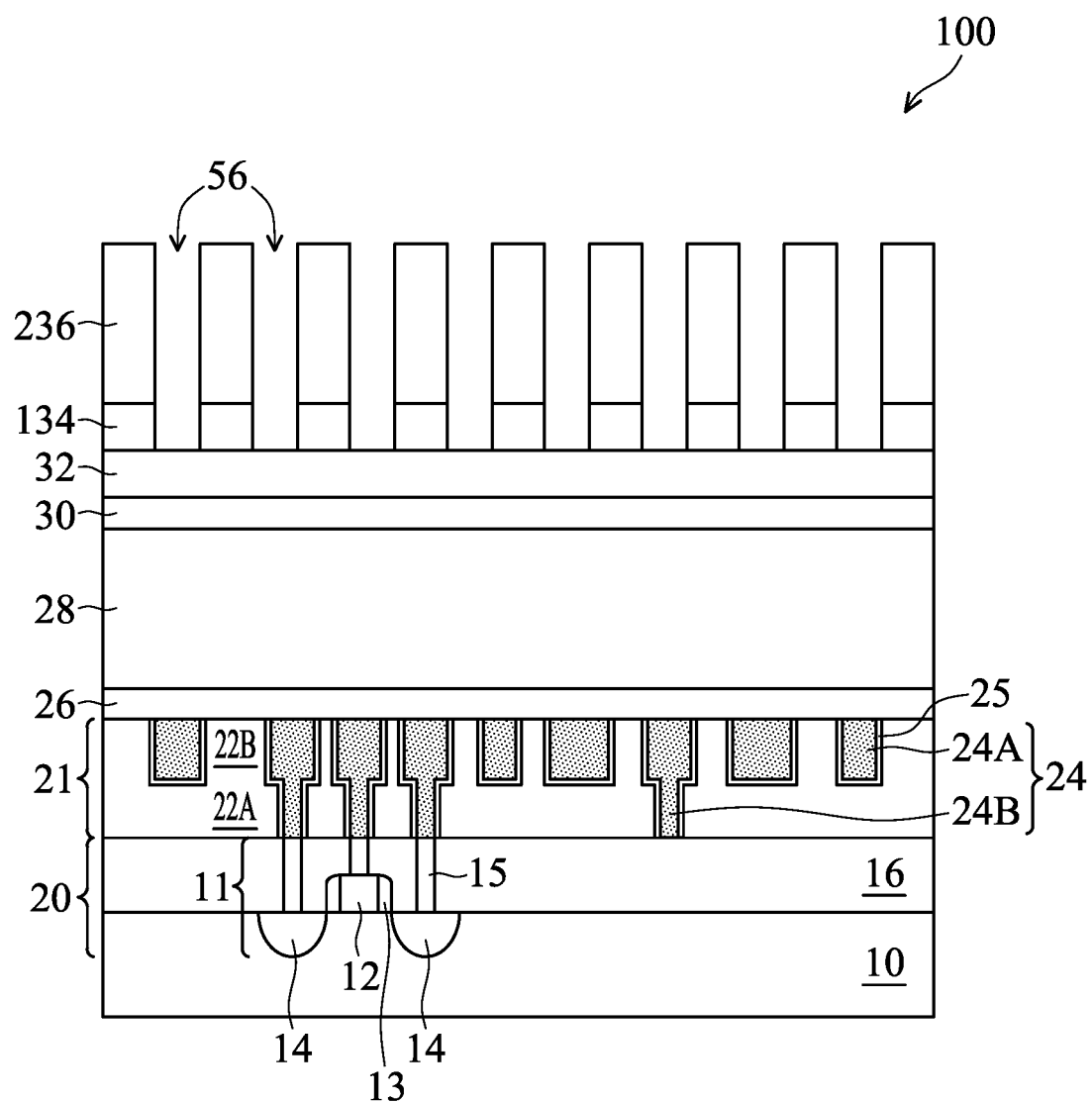

Referring to FIG. 7, following the etching of pattern mask layer 236, patterned bottom layer 238 may be removed by an ashing process. Next, dielectric mask 34 is etched using patterned mask layer 236 as an etching mask, so that the pattern of pattern mask layer 236 is transferred to dielectric mask 34 to create a dielectric mask 134 which is now patterned. Dielectric mask 134 has openings 56 which have been extended from openings 54. The etching of Dielectric mask 134 may be performed by any suitable technique, such as by a wet or dry etch selective to the material of dielectric mask 34. In some embodiments, the etching of dielectric mask 134 may consume pattern mask layer 236.

Figure 8:
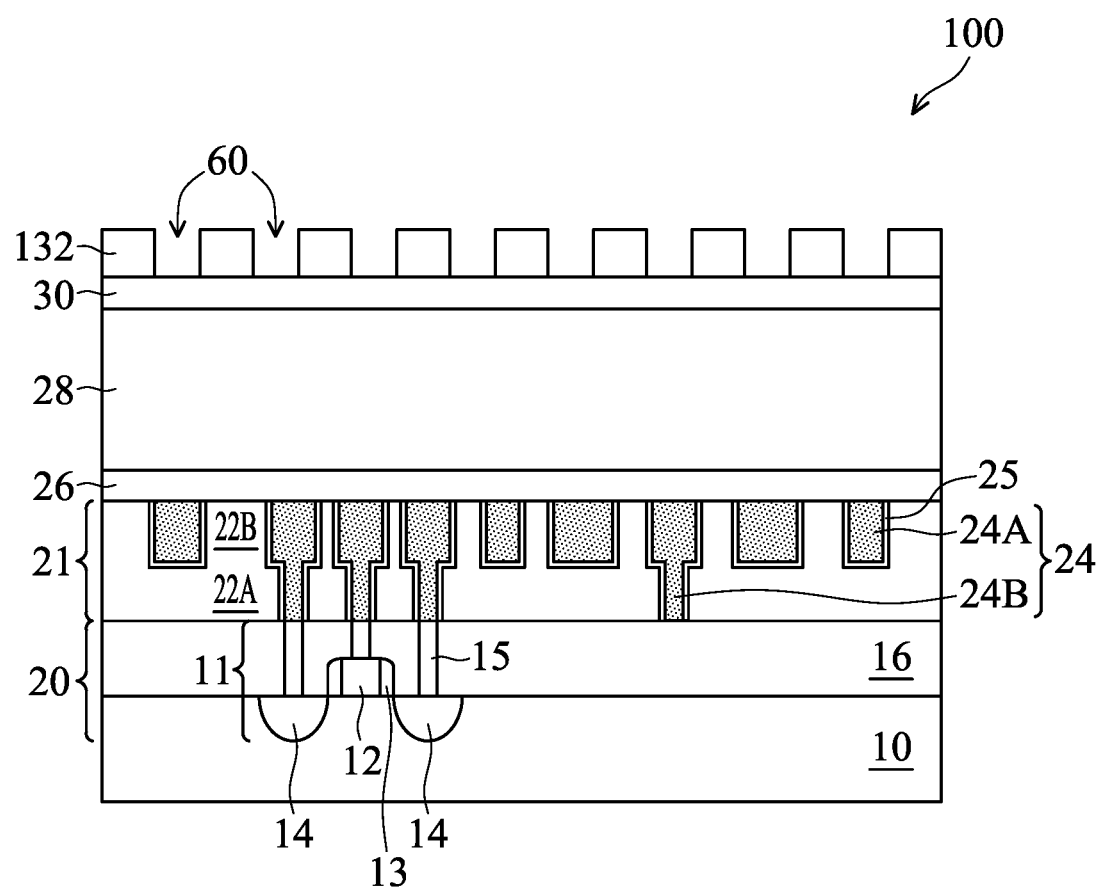

Referring to FIG. 8, following the etching of dielectric mask 134, dielectric mask 134 is used to pattern mask 32 to create mask 132. Mask 32 is etched using dielectric mask 134 as an etching mask, so that the pattern of dielectric mask 134 is transferred to mask 32 to create mask 132 which is now patterned. Mask 132 has etched openings 60 which have been extended from openings 56. The etchant and etching technique used can be selective to the material of mask 132.

Figure 9:
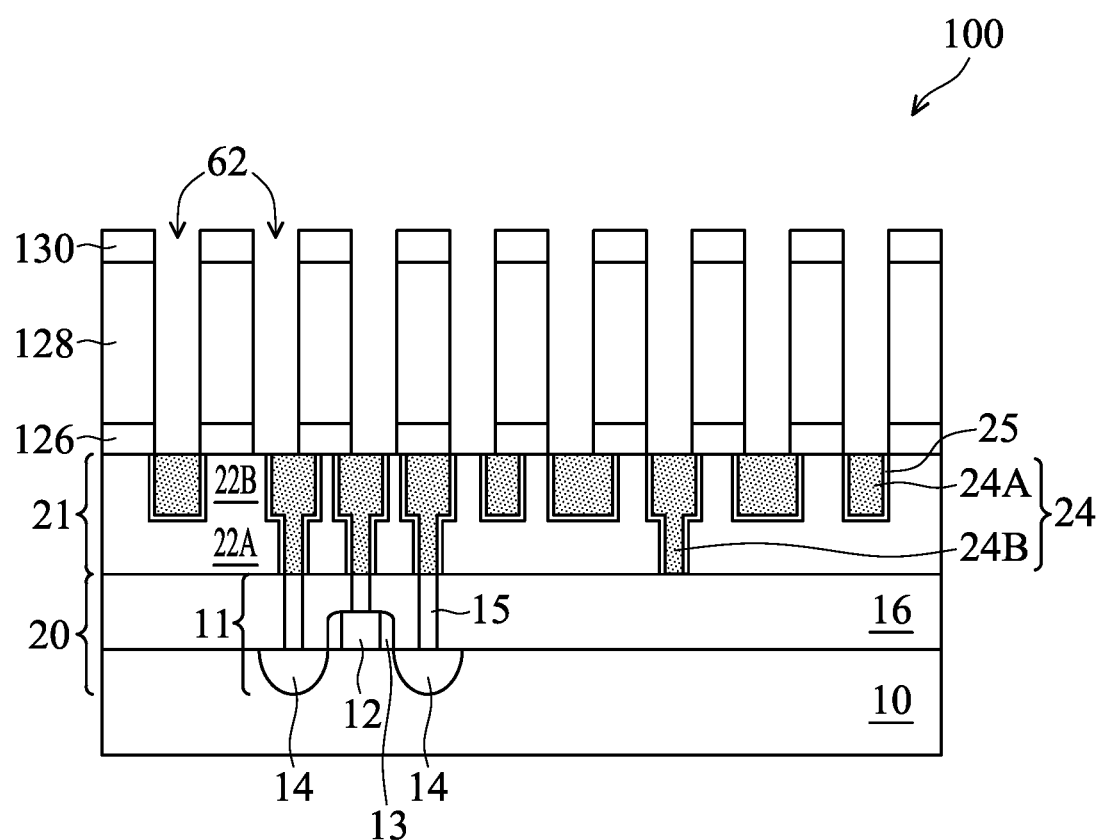

In FIG. 9, the mask 132 is used as an etching mask to progressively transfer the pattern of mask 132 to the underlying dielectric mask 30, target dielectric layer 28, and etch stop layer 26 by etching each layer in turn. Openings 62 are formed by extending openings 60 into the underlying layers. In some embodiments, prior to using mask 132 as a mask in etching the underlying layers, the remaining portions (if any) of dielectric mask 134 may be removed by a separate process. In some embodiments, the remaining portions of dielectric mask 134 may be removed simultaneously with etching mask 130. Target dielectric layer 128 and etch stop layer 126 may be formed by using a suitable etching technique such as a wet or dry etch using an appropriate etchant which is selective to the material of target dielectric layer 128 and etch stop layer 126. In particular, target dielectric layer 128 may be etched using a plasma or RIE anisotropic etch so that the width of the openings 62 is relatively uniform within process variations.

Next, mask 132 is removed, and the resulting structure is shown in FIG. 9. Etch stop layer 126 may be etched to expose conductive features 24 before or after the mask 132 is removed. Openings 62 may include trenches and/or vias. For example, vias may reach the exposed conductive features 24, while trenches may be formed to have a bottom which is between the topmost surface of target dielectric layer 128 and the bottommost surface of to target dielectric layer 128.

As a result of the lower aspect ratio of patterned bottom layer 238 of the tri-layer, pattern mask layer 236 forms a mask with substantially straight (non-wiggly) sidewalls, in a top down view, which result in openings 62 also being straight (non-wiggly).

Figure 10:
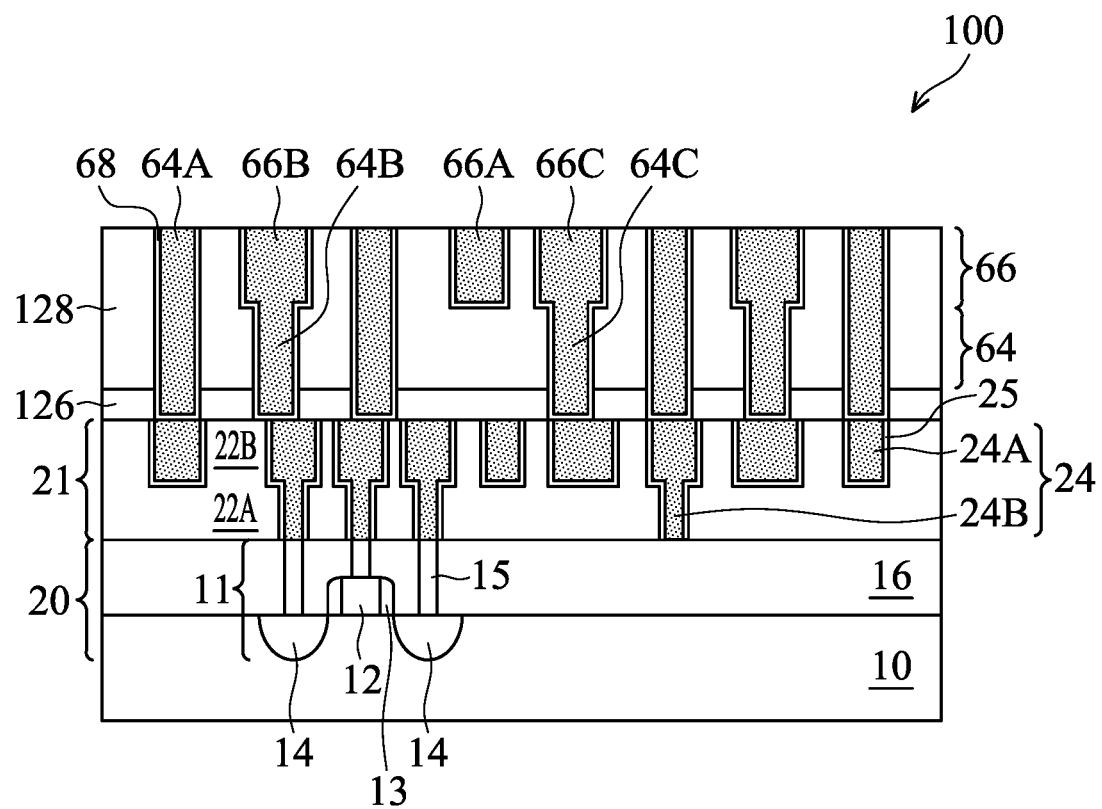

FIG. 10 illustrates the formation of conductive vias 64A, 64B, and 64C (collectively referred to as vias 64) in openings 62 (FIG. 9). Conductive lines 66A, 66B, and 66C (collectively referred to as conductive lines 66) are also formed in openings 62. Vias 64 and conductive lines 66 may include liners 68, which may be diffusion barrier layers, adhesion layers, and/or the like. Liners 68 may be conductive. Liners 68 may be formed of titanium, titanium nitride, tantalum, tantalum nitride, or other alternatives. The inner regions of conductive lines 66 and vias 64 include a conductive material such as copper, a copper alloy, silver, gold, tungsten, aluminum, or the like. In accordance with some embodiments, the formation of vias 64 and conductive lines 66 includes performing a blanket deposition to form liner 68, depositing a thin seed layer of copper or copper alloy over the liner, and filling the rest of openings 62 with metallic material, for example, through electro-plating, electro-less plating, deposition, or the like. A planarization such as a CMP is then performed to level the surface of conductive lines 66, and to remove excess conductive materials from the top surface of target dielectric layer 128. Mask 130 (FIG. 8) may be removed in the planarization or etched after the planarization. The cross-sectional view of FIG. 10 may be, for example, along the line A-A of FIG. 14.

In subsequent steps, an additional etch stop layer (not shown) may be formed, and more low-k dielectric layers, metal lines, and vias (not shown) may be formed over the additional etch stop layer. The process steps and resulting structures may be similar to what are shown in FIGS. 1 through 10.

Figure 11:
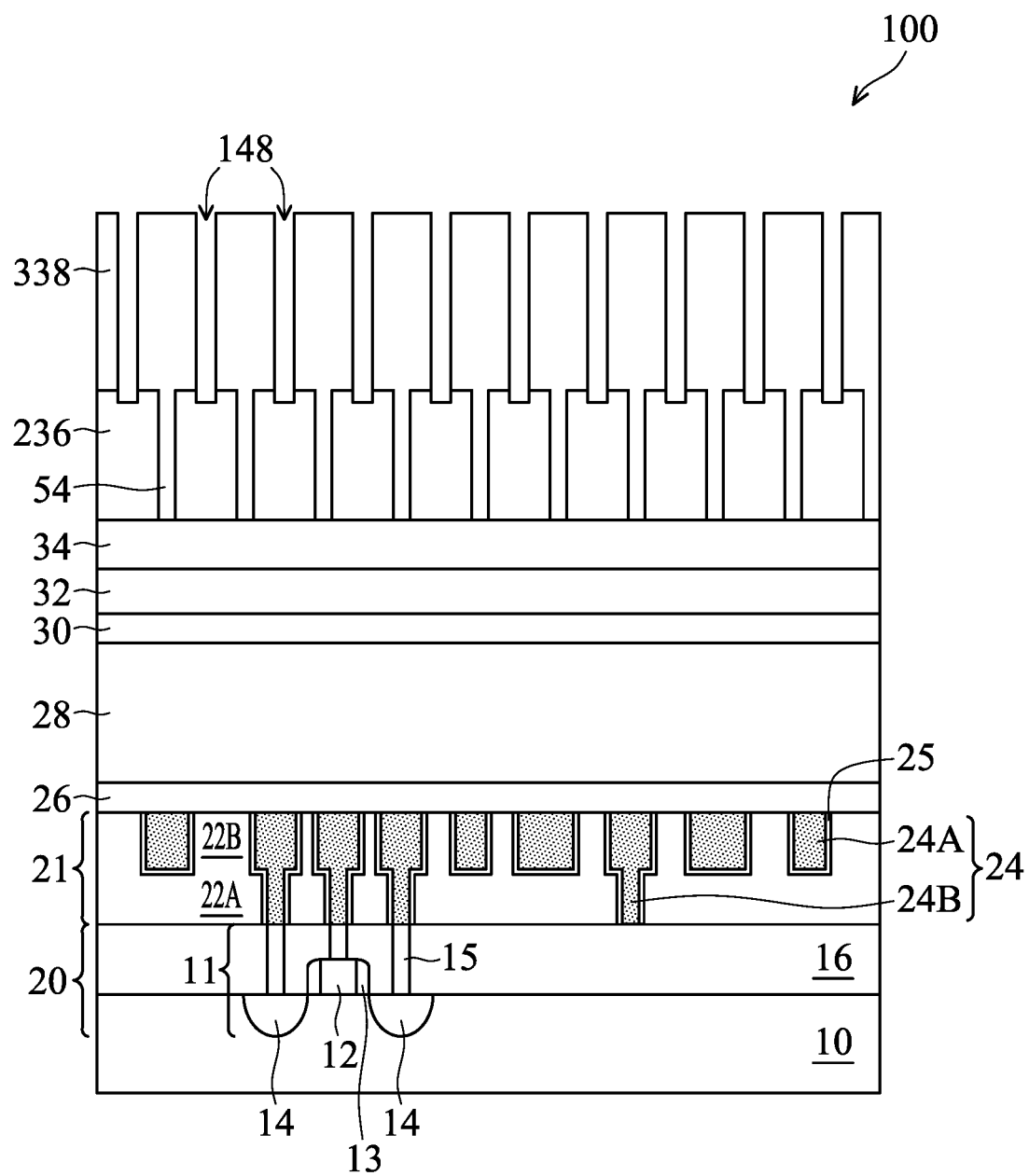
FIG. 11 illustrates an intermediate step of a double patterning method of forming a metal line having a reduced wiggle, in accordance with some embodiments.

The process shown and described above with reference to FIGS. 1 through 10 may be used to perform multiple patterning techniques, such as 2P2E or SADP. For example, FIG. 11 illustrates an intermediate step of a 2P2E process after a first patterning completes the steps described above with respect to FIGS. 1 through 6. After the pattern of patterned bottom layer 238 is transferred to the pattern mask layer 236 (in FIG. 6), any remaining remnants of the tri-layer (e.g., upper layer 42, patterned middle layer 140, and patterned bottom layer 238) may be removed, and a new tri-layer formed over the pattern mask layer 236. After the new tri-layer is formed over the pattern mask layer 236, the process described above with respect to FIGS. 1 through 6 may be repeated to form patterned bottom layer 338, which is used to pattern a different portion of the pattern mask layer 236. FIG. 11 illustrates the openings 54 (FIG. 6) formed from a first patterning process which are filled with a resist material which may be the same material used in patterned bottom layer 338. Patterned bottom layer 338 of the tri-layer has been patterned using a process similar to that described above with respect to FIGS. 1 through 5. In the next step (not shown), the pattern of patterned bottom layer 338 may be transferred to the pattern mask layer 236. Subsequent steps may follow in a process similar to that discussed above with respect to FIGS. 7 through 10. A similar process can be used for additional patterning (e.g., 3P3E) of the same pattern mask layer 236 prior to transfer of the pattern mask layer 236 to underlying layers. As a result of the multiple patterning technique, the pitch of the openings $p_2$ may be formed at a finer pitch than attainable in a single patterning technique, such as about 20 nm to about 50 nm, such as about 30 nm. Other pitches can be used.

Figure 12:
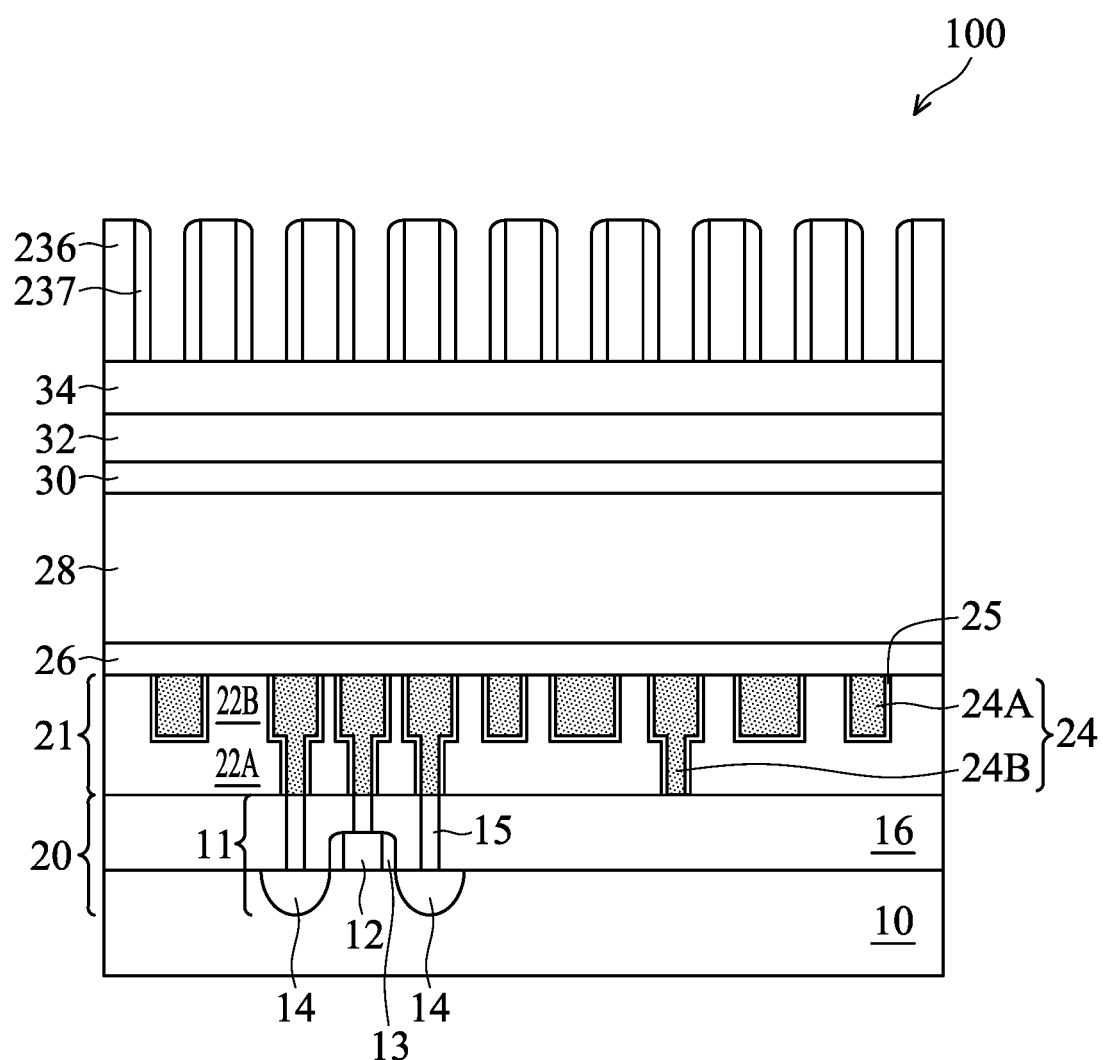
FIGS. 12-13 illustrates intermediate steps of a self-aligned double patterning method of forming a metal line having a reduced wiggle, in accordance with some embodiments.
Figure 13:
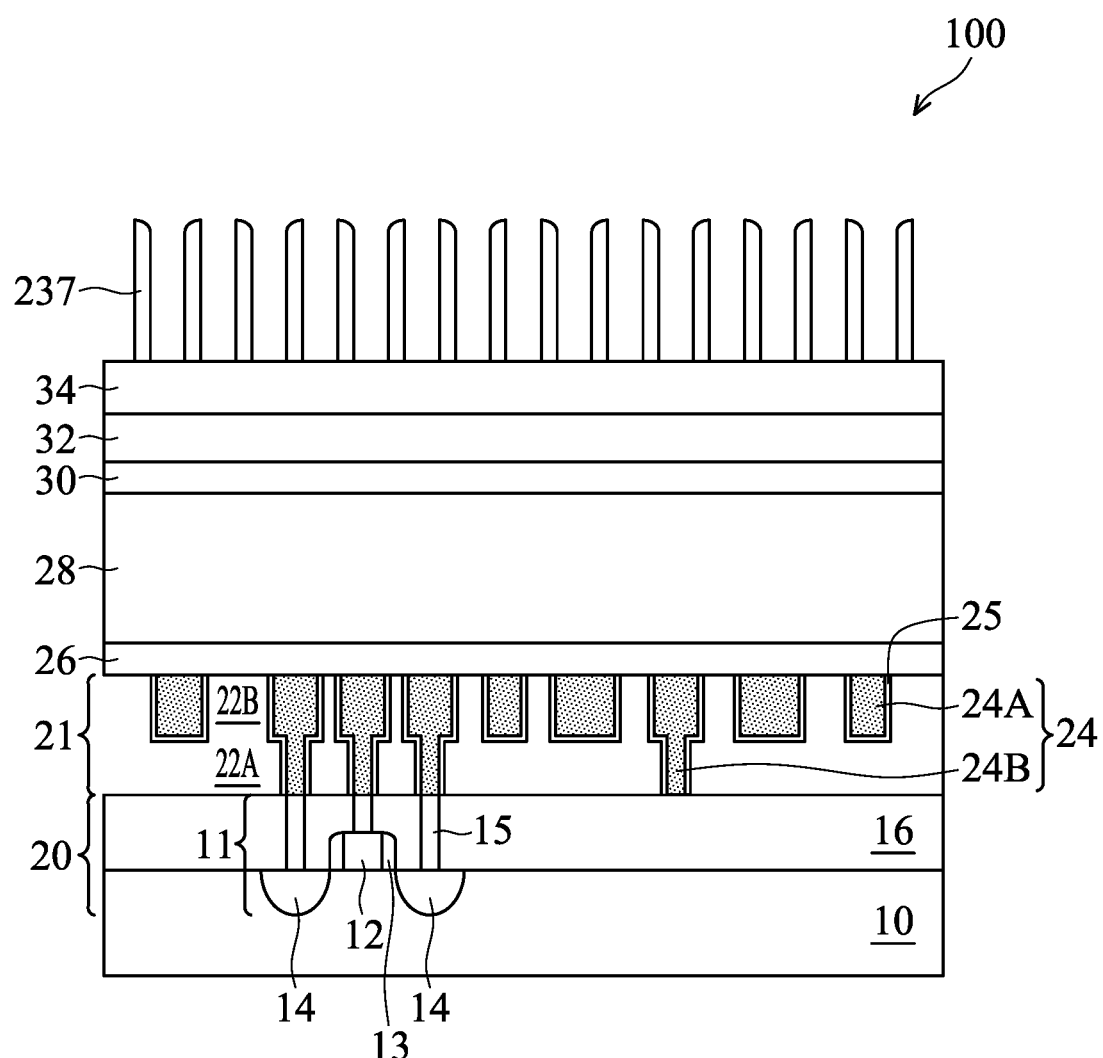

FIGS. 12 and 13 illustrate intermediate steps of a SADP process. In a SADP process, with reference to FIG. 6, after the pattern of patterned bottom layer 238 is transferred to the pattern mask layer 236, patterned bottom layer 238 may be removed. In this embodiment, pattern mask layer 236 is a mandrel layer for double patterning. Next, spacer material may be deposited over pattern mask layer 236. Next, as illustrated in FIG. 12, the spacer material may be anisotropically etched using a suitable technique to remove horizontal portions of the spacer material, resulting in spacer mask 237. Next, as illustrated in FIG. 13, the mandrels may be removed and spacer mask 237 may be used in subsequent steps in place of pattern mask layer 236, such as those discussed above with respect to FIGS. 7 through 10. As a result of the SADP technique, the pitch of the openings $p_3$ may be formed at a finer pitch that attainable in a single patterning technique, such as about 10 nm to about 40 nm, such as about 20 nm. Other pitches can be used.

Figure 14:
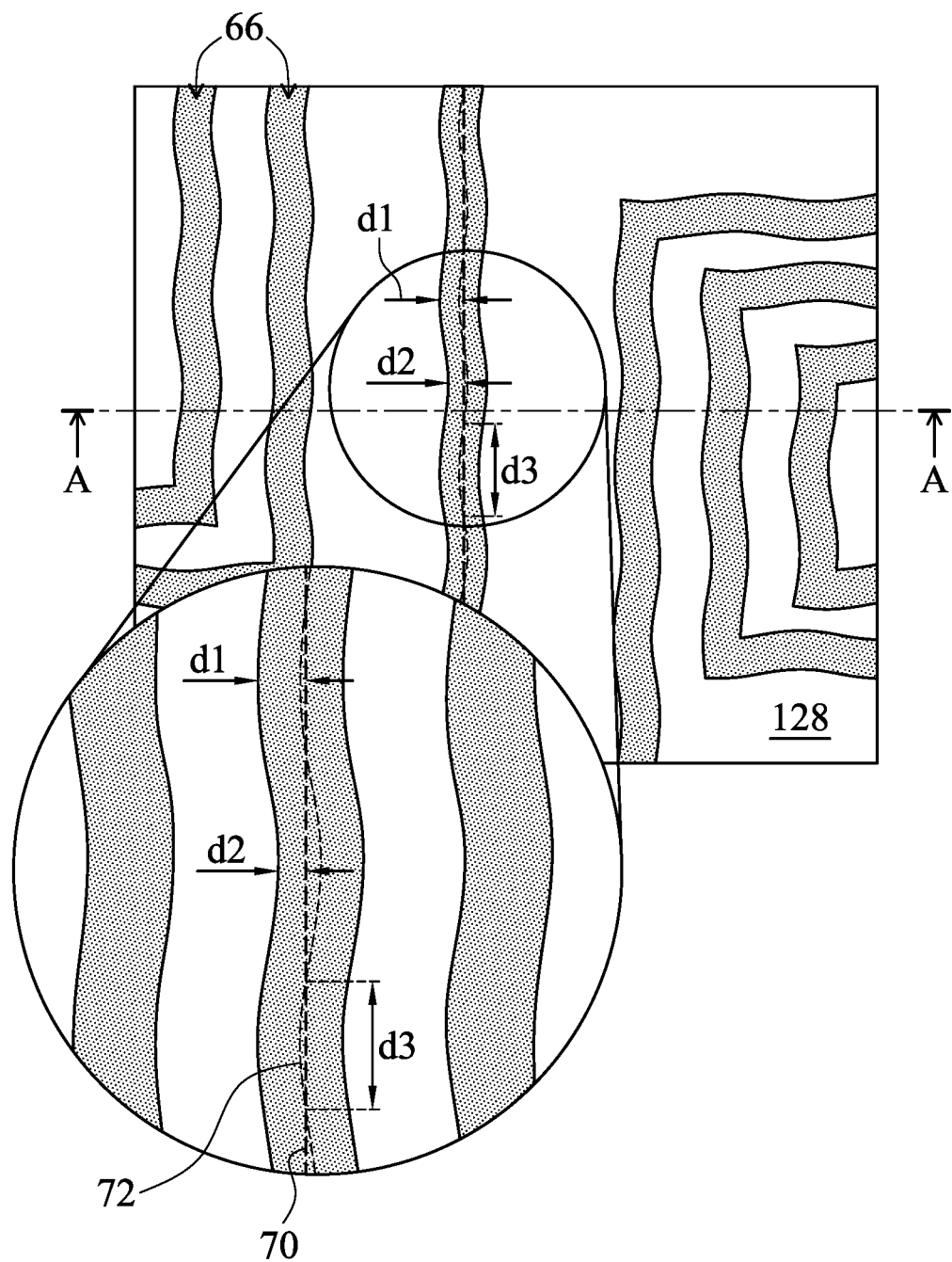
FIG. 14 illustrates a top-down view of a series of metal lines having reduced wiggle which are formed according to a pattern, in accordance with some embodiments.

FIG. 14 illustrates a top down view of the conductive lines 66 following the planarization discussed with reference to FIG. 10. The wiggle characteristics of the conductive lines 66 may be illustrated by midline 70 and centerline 72 of conductive line 66. The midline 70 can be understood as being the average midline of conductive line 66, which is parallel to a major direction of conductive line 66. The centerline 72 can be understood as a line consisting of the middle points of all lines perpendicular to a major direction of conductive line 66 drawn between the two sidewalls of conductive line 66. In other words, the centerline is in the actual center of conductive line 66. The distance $d_1$ is the maximum distance (i.e., furthest point) from the midline 70 to a sidewall of the conductive line 66. The distance $d_2$ is the minimum distance (i.e., nearest point) from the midline 70 to a sidewall of the conductive line 66. The distance $d_3$ is a distance between two points on the line where the midline 70 and centerline 72 intersect. This may be an indicator of the frequency of the wiggle, i.e., a measure of the linear distance over which the sidewall intrudes or protrudes from an ideal (perfectly straight) sidewall. If conductive line 66 were to have no wiggle (being perfectly straight), the difference between $d_1$ and $d_2$ would be zero. That is, $d_1$ would equal $d_2$. Using the techniques disclosed herein to reduce wiggle in the target layer (and conductive line 66 formed therein), the difference $d_1-d_2$ may be between zero and 30 Å, such as about 25 Å. In some embodiments the difference $d_1-d_2$ may be a non-zero number less than about 30 Å, such as about 25 Å. In some embodiments, the distance $d_3$ may be between about 10 Å and 100 Å, such as about 50 Å.

Figure 15:
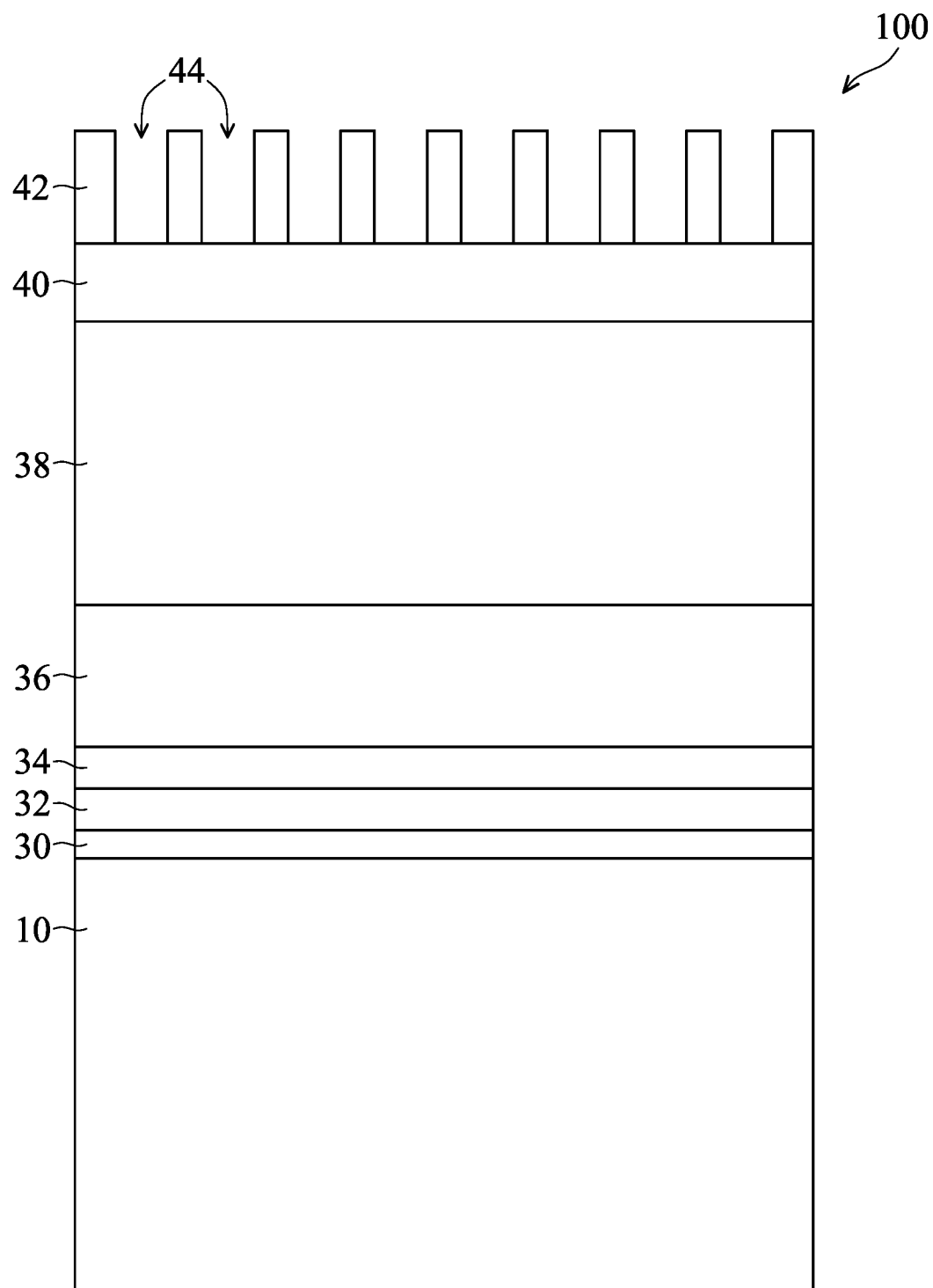
FIGS. 15-16 illustrate intermediate steps of a method for forming semiconductor strips in a semiconductor substrate, in accordance with some embodiments.
Figure 16:
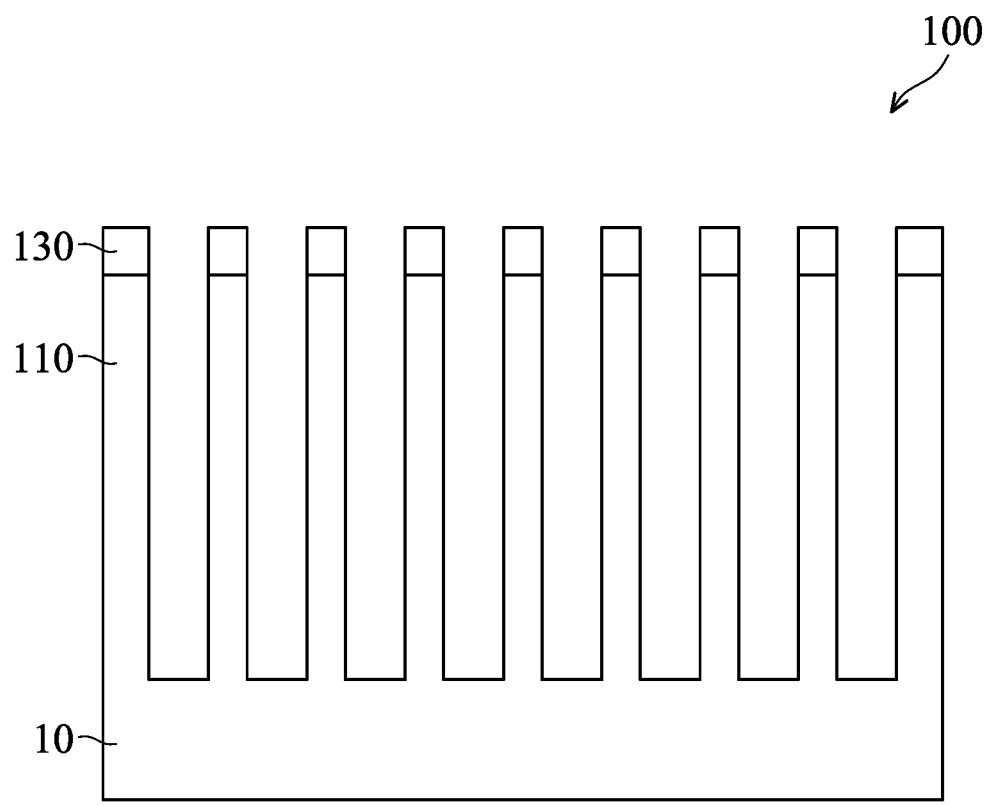

FIGS. 15 and 16 illustrate patterning of a substrate in accordance with some embodiments. FIG. 15 illustrates a substrate 10 which will be subsequently patterned to form fins as part of one or more fin field-effect transistors (FinFETs). The layers presented in FIG. 15 may be the same or similar to those depicted in FIG. 1, except that no active devices are yet formed in the substrate 10. The steps to pattern the patterned mask layer 36 may follow as described above with respect to FIGS. 1-6. In some embodiments, one or more of mask 30, mask 32, and dielectric mask 34 may be omitted. Where present, mask 30, mask 32, and dielectric mask 34 may be patterned using processes and materials such as described above with respect to FIGS. 7-9. Mask 130 (see FIG. 9), may be used to pattern the substrate 10 to form semiconductor strips 110. As a result of using the process described above, the semiconductor strips 110 may be formed such that they have reduced wiggle.

Following the formation of semiconductor strips 110, the semiconductor strips 110 may be used to form a FinFET device, such as transistor 11 (FIG. 1). In particular, a gate structure, such as gate electrode 12 and gate spacers 13 of FIG. 1, may be formed over the semiconductor strips 110, perpendicular to the direction of the semiconductor strips 110. Source/drain regions, such as source/drain regions 14 of FIG. 1, may be formed adjacent to the gate structure. Transistor gate and source/drain contacts 15 may be formed to contact the transistor 11.

Embodiments disclosed herein provide a way to create metal lines in devices at fine pitches having less wiggle than in other techniques. Eliminating or reducing wiggle provides for more reliable interconnects at finer pitch widths.

One embodiment is a method that includes forming a pattern layer over a substrate. A first mask layer is deposited over the silicon layer. The first mask layer is patterned to form one or more openings therein. The first mask layer is thinned and the one or more openings of the first mask layer are widened. The pattern of the first mask layer is then transferred to the pattern layer.

Another embodiment is a method that includes forming a dielectric layer over a substrate that contains one or more active devices. A masking layer is formed over the dielectric layer. A tri-layer is formed over the masking layer, where the tri-layer includes a top layer of a first material, a middle layer of a second material, and a bottom layer of a third material. The top layer is patterned to form a first set of openings. Then the pattern of the top layer is transferred to the middle layer to form a second set of openings. Next, the pattern of the middle layer is transferred to the bottom layer to form a third set of openings. The third set of openings is then simultaneously enlarged in a first dimension while being reduced in a second dimension. The masking layer is then etched through the third set of openings.

Another embodiment includes a device having a substrate with one or more active devices formed therein. The device includes a contact coupled to a first active device of the one or more active devices. The device includes an interconnect over the contact. The interconnect includes a metal line coupled to the contact. The metal line has a first portion which overlaps the contact. The first portion of the metal line wiggles. A perpendicular distance between the average midline of the first portion of the metal line and a furthest point of a sidewall of the first portion of the metal line is a first distance.

A perpendicular distance between the average midline of the metal line and a nearest point of the sidewall of the first portion of the metal line is a second distance. The difference between the first distance from the second distance is greater than zero and less than 30 Å. A pitch between the first portion of the metal line and a closest adjacent metal line is between 30 nm and about 50 nm.

Another embodiment is a method including etching a first mask layer to form a first opening therein. The method also includes thinning the first mask layer. The method also includes widening the first opening in the first mask layer. The method also includes etching a pattern layer underlying the first mask layer through the first opening.

Another embodiment is a method including depositing a pattern layer over a target layer, the target layer overlying a device contact. A first mask layer is deposited over the pattern layer. The first mask layer is etched to form a first opening in the first mask layer. The method also includes reducing a height to width ratio of the first opening. The first opening is extended to the pattern layer. The target layer is etched based on a pattern of the pattern layer to form a second opening in the target layer, the second opening exposing the device contact. A conductive material is deposited in the second opening, the conductive material electrically coupled to the device contact.

Another embodiment is a method including etching a pattern layer underlying a first mask layer through a first opening in the first mask layer. The method also includes transferring a pattern of the pattern layer to an insulating layer of an interconnect to form a second opening the insulating layer. The method also includes forming a metal line in the second opening, the metal line coupled to a contact, the metal line having a first portion which overlaps the contact, the first portion of the metal line having a lateral wiggle, where a perpendicular distance between an average midline of the first portion of the metal line and an furthest point of a sidewall of the first portion of the metal line is a first distance, where a perpendicular distance between the average midline of the first portion of the metal line and a nearest point of a sidewall of the first portion of the metal line is a second distance, a difference between the first distance and the second distance being greater than zero and less than 30 and where a pitch between the first portion of the metal line and a closest adjacent metal line is between 30 and 50 nm.

Another embodiment is a method including depositing a pattern layer over a target layer. The method also includes depositing a first mask layer over the pattern layer. The method also includes etching the first mask layer to form a first opening in the first mask layer. The method also includes reducing a height to width ratio of the first opening. The method also includes extending the first opening to the pattern layer. The method also includes etching the target layer based on a pattern of the pattern layer to form a patterned target layer.

Another embodiment is a method including forming a metal line in an insulating layer disposed over a contact layer, the insulating layer being a layer of an interconnect. The metal line is coupled to a contact disposed in the contact layer and has a first portion which overlaps the contact. The first portion of the metal line has a wiggle along its length, where a perpendicular distance between an average midline of the first portion of the metal line and an furthest point of a sidewall of the first portion of the metal line is a first distance, and a perpendicular distance between the average midline of the first portion of the metal line and a nearest point of a sidewall of the first portion of the metal line is a second distance. A difference between the first distance and the second distance is greater than zero and less than 30 Å.

Another embodiment is a device including a contact disposed in a contact layer. The device also includes an insulating layer disposed over the contact layer, the insulating layer being a layer of an interconnect. The device also includes a metal line disposed in the insulating layer, the metal line coupled to the contact, the metal line having a first portion which overlaps the contact, the first portion of the metal line having a wiggle along its length, where a perpendicular distance between an average midline of the first portion of the metal line and an furthest point of a sidewall of the first portion of the metal line is a first distance, where a perpendicular distance between the average midline of the first portion of the metal line and a nearest point of a sidewall of the first portion of the metal line is a second distance, a difference between the first distance and the second distance being greater than zero and less than 30 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a pattern layer over a target layer;
depositing a first mask layer over the pattern layer;
etching the first mask layer to form a first opening in the first mask layer;
reducing a height-to-width ratio of the first opening;
after reducing the height-to-width ratio, extending the first opening to the pattern layer; and
etching the target layer based on a pattern of the pattern layer to form a patterned target layer.

2. The method of claim 1, wherein reducing the height-to-width ratio of the first opening comprises thinning the first mask layer.

3. The method of claim 2, wherein reducing the height-to-width ratio of the first opening further comprises enlarging a width of the first opening.

4. The method of claim 1, further comprising:
forming a metal line in the patterned target layer, the metal line electrically coupled to an underlying contact.

5. The method of claim 1, wherein the height-to-width ratio is reduced between about 25% and 75%.

6. The method of claim 5, wherein prior to reducing the height-to-width ratio of the first opening, the height-to-width ratio is between 3 and 15, and wherein following reducing the height-to-width ratio of the first opening, the height-to-width ratio of the first opening is between 1.5 and 4.

7. A method comprising:
forming a metal line in an insulating layer disposed over a contact layer, the insulating layer being a layer of an interconnect, the metal line coupled to a contact disposed in the contact layer, the metal line having a first portion which overlaps the contact, the first portion of the metal line having a wiggle along its length, wherein a perpendicular distance between an average midline of the first portion of the metal line and a furthest point of a sidewall of the first portion of the metal line is a first distance, wherein a perpendicular distance between the average midline of the first portion of the metal line and a nearest point of a sidewall of the first portion of the metal line is a second distance, a difference between the first distance and the second distance being greater than zero and less than 30 Å.

8. The method of claim 7, wherein, along the first portion of the metal line, a center line of the first portion of the metal line crosses the average midline at a first position and the center line of the first portion of the metal line crosses the average midline again at a second position, the first position separated from the second position by between 10 Å and 100 Å.

9. The method of claim 8, wherein the first portion of the metal line includes at least 4 intersections of the average midline and the center line.

10. The method of claim 7, wherein two adjacent wiggles of the first portion of the metal line are between 10 Å and 100 Å apart.

11. The method of claim 7, wherein a pitch between the first portion of the metal line and a closest adjacent metal line is between 30 and 50 nm.

12. The method of claim 7, wherein the average midline of the first portion of the metal line runs in a first direction, wherein an average midline of a second portion of the metal line runs in a second direction perpendicular to the first direction.

13. The method of claim 12, wherein the first portion is continuously connected to the second portion.

14. A device comprising:
a contact disposed in a contact layer;
an insulating layer disposed over the contact layer, the insulating layer being a layer of an interconnect; and
a metal line disposed in the insulating layer, the metal line coupled to the contact, the metal line having a first portion which overlaps the contact, the first portion of the metal line having a wiggle along its length, wherein a perpendicular distance between an average midline of the first portion of the metal line and a furthest point of a sidewall of the first portion of the metal line is a first distance, wherein a perpendicular distance between the average midline of the first portion of the metal line and a nearest point of a sidewall of the first portion of the metal line is a second distance, a difference between the first distance and the second distance being greater than zero and less than 30 Å.

15. The device of claim 14, wherein, along the first portion of the metal line, a center line of the first portion of the metal line crosses the average midline at a first position and the center line of the first portion of the metal line crosses the average midline again at a second position, the first position separated from the second position by between 10 Å and 100 Å.

16. The device of claim 15, wherein the first portion of the metal line includes at least 4 intersections of the average midline and the center line.

17. The device of claim 14, wherein two adjacent wiggles of the first portion of the metal line are between 10 Å and 100 Å apart.

18. The device of claim 14, wherein a pitch between the first portion of the metal line and a closest adjacent metal line is between 30 and 50 nm.

19. The device of claim 14, wherein the average midline of the first portion of the metal line runs in a first direction, wherein an average midline of a second portion of the metal line runs in a second direction perpendicular to the first direction.

20. The device of claim 19, wherein the first portion is continuously connected to the second portion.

* * * * *